(12) United States Patent
Choi et al.

(10) Patent No.: US 10,096,750 B2
(45) Date of Patent: Oct. 9, 2018

(54) DISPLAY DEVICE USING SEMICONDUCTOR LIGHT EMITTING DEVICE AND METHOD FOR MANUFACTURING

(71) Applicant: LG ELECTRONICS INC., Seoul (KR)

(72) Inventors: Hwanjoon Choi, Seoul (KR); Yonghan Lee, Seoul (KR); Sungjin Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/208,752

(22) Filed: Jul. 13, 2016

(65) Prior Publication Data

US 2017/0200765 A1    Jul. 13, 2017

(30) Foreign Application Priority Data

Jan. 11, 2016  (KR) .......................... 10-2016-0003384

(51) Int. Cl.
*H01L 33/50*  (2010.01)
*H01L 25/075*  (2006.01)
(Continued)

(52) U.S. Cl.
CPC ........ *H01L 33/504* (2013.01); *H01L 25/0753* (2013.01); *H01L 33/60* (2013.01);
(Continued)

(58) Field of Classification Search
None
See application file for complete search history.

(56) References Cited

U.S. PATENT DOCUMENTS

| 8,237,346 B2 | 8/2012 | Egi et al. |
| 2007/0007883 A1* | 1/2007 | Takeda ..................... B41M 1/10 313/503 |

(Continued)

FOREIGN PATENT DOCUMENTS

| CN | 102376849 A | 3/2012 |
| CN | 102918668 A | 2/2013 |

(Continued)

*Primary Examiner* — Fazli Erdem
*Assistant Examiner* — Scott R Wilson
(74) *Attorney, Agent, or Firm* — Birch, Stewart, Kolasch & Birch, LLP

(57) ABSTRACT

A display device include a substrate including a wiring electrode; an adhesive layer disposed on the substrate; a plurality of semiconductor light emitting devices adhered to the adhesive layer, and electrically connected to the wiring electrode; and a phosphor layer disposed to cover the plurality of semiconductor light emitting devices. Further, the phosphor layer includes a plurality of phosphor portions for converting a wavelength of light, and a plurality of partition wall portions formed between the plurality of phosphor portions, and the plurality of partition wall portions are sequentially disposed between the phosphor portions along a first direction and a second direction crossing each other, respectively, and at least one of the sequentially disposed partition wall portions overlaps with at least one of the plurality of semiconductor light emitting devices.

16 Claims, 24 Drawing Sheets

(51) Int. Cl.
*H01L 33/60* (2010.01)
*H01L 33/62* (2010.01)

(52) U.S. Cl.
CPC ...... *H01L 33/62* (2013.01); *H01L 2933/0041* (2013.01); *H01L 2933/0066* (2013.01)

(56) References Cited

U.S. PATENT DOCUMENTS

| | | | |
|---|---|---|---|
| 2012/0033402 A1 | 2/2012 | Harada | |
| 2012/0313120 A1* | 12/2012 | Bisberg | H01L 33/505 257/88 |
| 2013/0082289 A1 | 4/2013 | Sakuta et al. | |
| 2014/0168572 A1 | 6/2014 | Iwata et al. | |
| 2015/0062870 A1* | 3/2015 | Kadowaki | G02F 1/133502 362/84 |
| 2016/0079485 A1* | 3/2016 | Akimoto | H01L 25/0753 257/88 |

FOREIGN PATENT DOCUMENTS

| | | |
|---|---|---|
| CN | 103733243 A | 4/2014 |
| CN | 104508822 A | 4/2015 |
| CN | 104584110 A | 4/2015 |
| CN | 105051804 A | 11/2015 |
| CN | 106024801 A | 10/2016 |
| TW | 200841373 A | 10/2008 |
| WO | WO 2014/163325 A1 | 10/2014 |
| WO | WO 2014163325 A1 * 10/2014 ......... H01L 25/0753 |

\* cited by examiner

ND METHOD FOR
DISPLAY DEVICE USING SEMICONDUCTOR LIGHT EMITTING DEVICE AND METHOD FOR MANUFACTURING

CROSS-REFERENCE TO RELATED APPLICATIONS

This application claims the benefit of priority of Korean Patent Application No. 10-2016-0003384, filed on Jan. 11, 2016, which is herein expressly incorporated by reference in their entireties.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs). However, there exist problems such as a slow response time, difficult implementation of flexibility in case of LCDs, and there exist drawbacks such as short life span, poor yield as well as low flexibility in case of AMOLEDs.

Further, light emitting diodes (LEDs) convert an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

A structure of exciting light emitted from the semiconductor light emitting device using a phosphor layer is applicable to a flexible display using the semiconductor light emitting device. In this instance, a partition wall structure for preventing mixed colors can be provided on the phosphor layer, but studies on this are insufficient. In particular, when implementing a high-definition display using a semiconductor light emitting device, a size of the semiconductor light emitting device should be reduced, but there is a restriction. In order to solve such a problem, a pentile type display driving scheme may be used for a display using the semiconductor light emitting device, but studies on its related partition wall structure have not been performed.

SUMMARY OF THE INVENTION

Accordingly, one aspect of the present disclosure is to provide a structure and a fabrication method thereof capable of further increasing a filling space of phosphor in a display device.

Another aspect of the present disclosure is to provide a display device having a new type of partition wall structure capable of allowing its flexibility and preventing mixed colors.

Still another aspect of the present disclosure is to implement a pentile type of structure in a display device using a semiconductor light emitting device.

A display device according to the present disclosure may include a substrate formed with a wiring electrode, an adhesive layer disposed on the substrate, a plurality of semiconductor light emitting devices adhered to the adhesive layer, and electrically connected to the wiring electrode, and a phosphor layer disposed to cover the plurality of semiconductor light emitting devices, wherein the phosphor layer includes a plurality of phosphor portions for converting a wavelength of light, and a plurality of partition wall portions formed between the plurality of phosphor portions, wherein the plurality of partition wall portions are sequentially disposed between the phosphor portions along a first direction and a second direction crossing each other, respectively, and at least one of the sequentially disposed partition wall portions overlaps with at least one of the plurality of semiconductor light emitting devices.

Furthermore, the present disclosure presents a fabrication method of a display device, and the method may include coupling a plurality of semiconductor light emitting devices to an adhesive layer formed on a substrate, and forming a phosphor layer disposed to cover the plurality of semiconductor light emitting devices, wherein the phosphor layer includes a plurality of phosphor portions for converting a wavelength of light and a plurality of partition wall portions formed between the plurality of phosphor portions, and the plurality of partition wall portions are sequentially disposed between the phosphor portions along a first direction and a second direction that cross each other, respectively, and at least one of the sequentially disposed partition wall portions overlaps with at least one of the plurality of semiconductor light emitting devices.

Furthermore, the present disclosure can implement a partition wall portion suitable to a display having a flexible characteristic as a light transmitting material is filled into a metal thin film. Thus, a flexible material may be used for a partition wall portion by the light transmitting material, and moreover, light emitted from a semiconductor light emitting device may be transmitted in a thickness direction of a phosphor layer. Accordingly, when blue light is emitted, it is possible to provide a structure in which the partition wall portion overlaps with a blue semiconductor light emitting device.

In addition, according to the present disclosure, a plurality of partition wall portions may be disposed between phosphor portions, respectively, in horizontal and vertical directions, thereby implementing a partition wall structure capable of increasing a size of the phosphor portion as well as preventing mixed colors on a pentile type hardware. Through this, it is possible to implement high resolution at the same pixel size compared to other types, and particularly, an area of pixel corresponding to green may be further secured, thereby enhancing efficiency.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
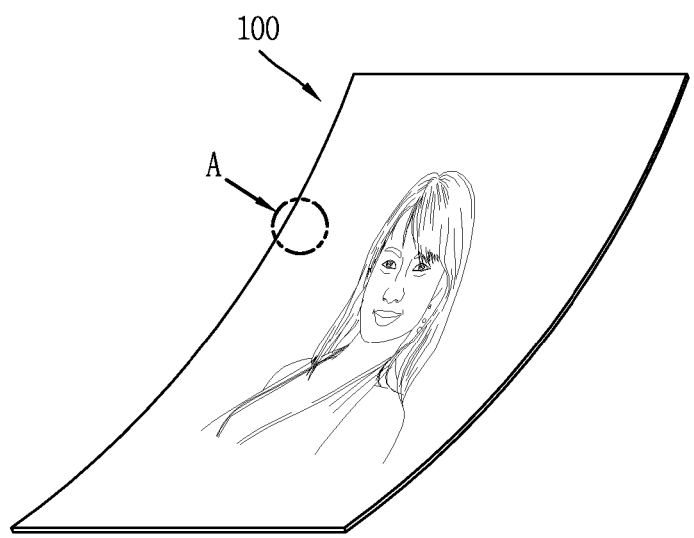
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure. According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be implemented by individually controlling the light emission of sub-pixels disposed in a matrix form. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
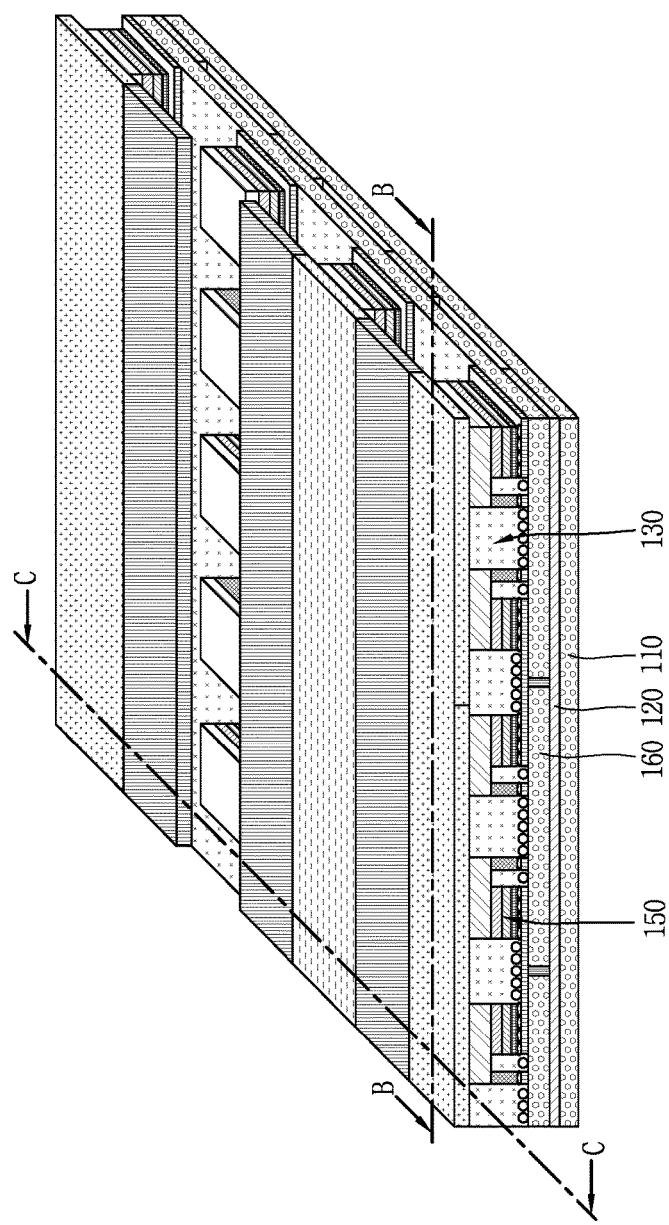
FIG. 2 is a partial enlarged view of portion "A" in FIG. 1.
Figure 3A:
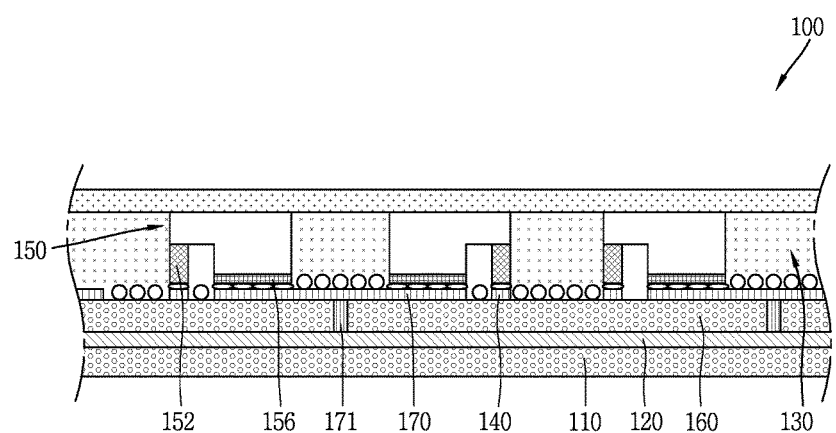
FIGS. 3A and 3B are cross-sectional views taken along lines B-B and C-C in FIG. 2.
Figure 3B:
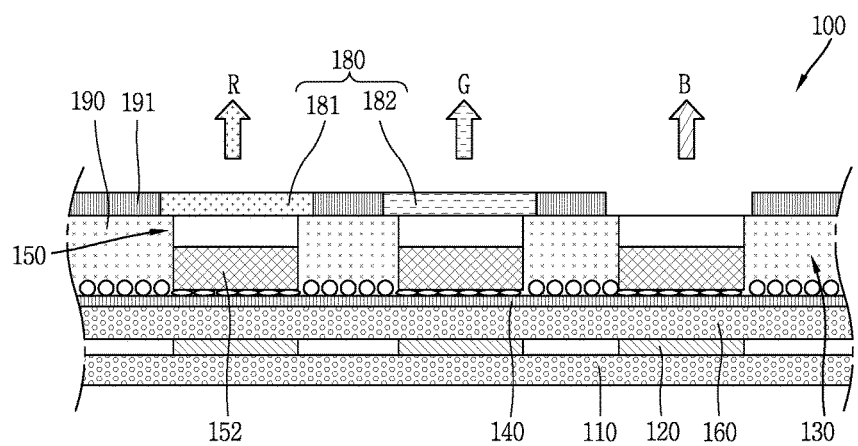
Figure 4:
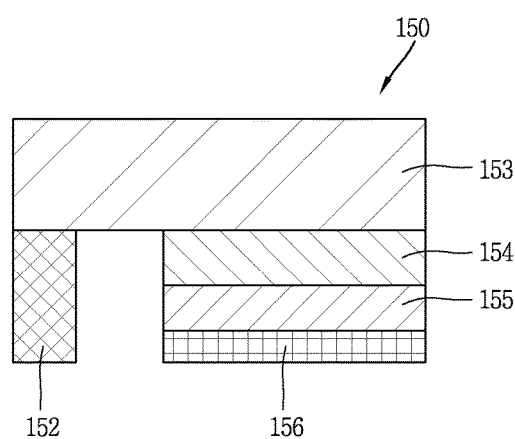
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device as a display device 100 using a semiconductor light emitting device. However, the following illustration is also applicable to an active matrix (AM) type semiconductor light emitting device.

The display device 100 includes a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials. The substrate 110 can be a wiring substrate disposed with the first electrode 120, and thus the first electrode 120 may be placed on the substrate 110.

According to the drawing, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and can be electrically connected to the first electrode 120 by an electrode hole 171 passing through the insulating layer 160. The electrode hole 171 may be formed by filling a conductive material in a via hole.

Referring to the drawings, the conductive adhesive layer 130 is formed on one surface of the insulating layer 160, but the present disclosure is not limited to this. For example, it is possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

Further, the conductive adhesive layer 130 can be a layer having adhesiveness and conductivity, and a conductive material and an adhesive material may be mixed on the conductive adhesive layer 130. Furthermore, the conductive adhesive layer 130 may have flexibility, thereby allowing a flexible function in the display device.

For example, the conductive adhesive layer 130 may be an anisotropic conductive film (ACF), an anisotropic conductive paste, a solution containing conductive particles, and the like. The conductive adhesive layer 130 allows electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

Further, the anisotropic conductive film includes an anisotropic conductive medium mixed with an insulating base member, and thus when heat and pressure are applied thereto, only a specific portion thereof can have conductivity by the anisotropic conductive medium. Hereinafter, heat and pressure are applied to the anisotropic conductive film, but other methods are also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present embodiment, the anisotropic conductive film includes an anisotropic conductive medium mixed with an insulating base member, and thus when heat and pressure are applied thereto, only a specific portion thereof can have conductivity by the conductive balls. The anisotropic conductive film may include a core with a conductive material containing a plurality of particles coated by an insulating layer with a polymer material, and in this instance, have conductivity by the core while breaking an insulating layer on a portion to which heat and pressure are applied. Here, a core may be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film.

In another example, an anisotropic conductive film may include a plurality of particles in which a conductive material is coated on insulating cores. In this instance, a portion to which heat and pressure are applied can be converted (pressed and adhered) to a conductive material to have conductivity in the thickness direction of the film. In still another example, the film may be formed to have conductivity in the thickness direction of the film in which a conductive material passes through an insulating base member in the z-direction. In this instance, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film can include conductive balls randomly mixed with an insulating base member or include a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 150 may be a flip chip type semiconductor light emitting device. For example, the semiconductor light emitting device 150 may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. Further, the p-type electrode 156 can be electrically connected to the welding portion 179 by the conductive adhesive layer 130, and the n-type electrode 152 can be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device.

Furthermore, a plurality of semiconductor light emitting devices 150 constitute a light-emitting array, and a phosphor layer 180 is formed on the light-emitting array. The light emitting device may include a plurality of semiconductor light emitting devices with different self luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. In addition, the semiconductor light emitting devices may be nitride semiconductor light emitting devices, for instance. The semiconductor light emitting device 150 has an excellent luminance characteristic, and thus it is possible to configure individual sub-pixels even with a small size thereof.

According to the drawing, a partition wall 190 can be formed between the semiconductor light emitting devices 150. In this instance, the partition wall 190 performs the role of dividing individual sub-pixels from one another, and can be formed as an integral body with the conductive adhesive layer 130. For example, a base member of the anisotropic conductive film can form the partition wall when the semiconductor light emitting device 150 is inserted into the anisotropic conductive film.

Furthermore, when the base member of the anisotropic conductive film is black, the partition wall 190 has reflective characteristics while at the same time increasing contrast with no additional black insulator. In another example, a reflective partition wall may be separately provided with the partition wall 190. In this instance, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel. More specifically, one color phosphor can be deposited along each line of the first electrode 120. Accordingly, one line on the first electrode 120 may be an electrode controlling one color. In other words, red (R), green (B) and blue (B) may be sequentially disposed, thereby implementing sub-pixels.

However, the present disclosure is not limited to this, and the semiconductor light emitting device 150 may be combined with a quantum dot (QD) instead of a phosphor to implement sub-pixels such as red (R), green (G) and blue (B). Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
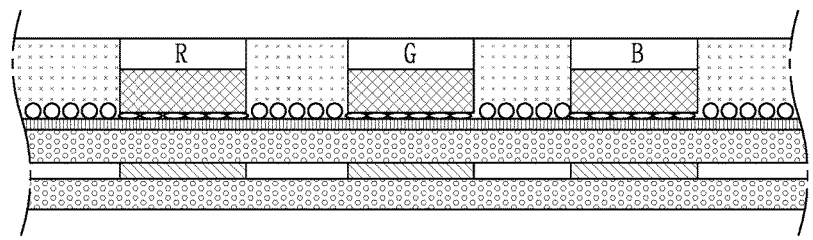
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
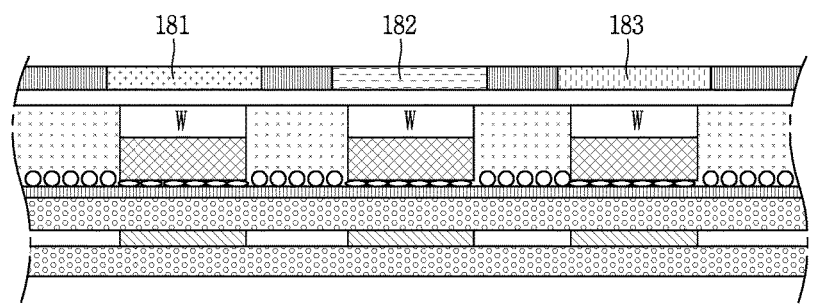

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 can be provided on the white light emitting device (W) to implement a sub-pixel. Furthermore, a color filter repeated with red, green and blue on the white light emitting device (W) may be used to implement a sub-pixel.

Figure 5C:
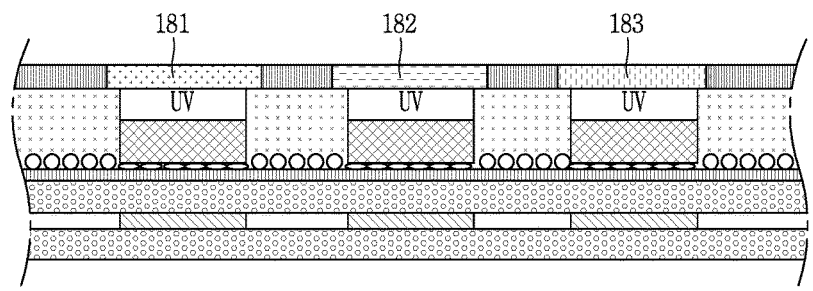

Referring to FIG. 5C, it is possible to also have a structure in which a red phosphor layer 181, a green phosphor layer 182 and blue phosphor layer 183 can be provided on a ultra violet light emitting device (UV). Thus, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it is possible to configure individual sub-pixels even with a small size thereof. The size of the individual semiconductor light emitting device 150 may be less than 80 μm in the length of one side thereof, and formed with a rectangular or square shaped element. For a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this instance, it is possible to implement a flexible display device having a HD image quality.

Figure 6:
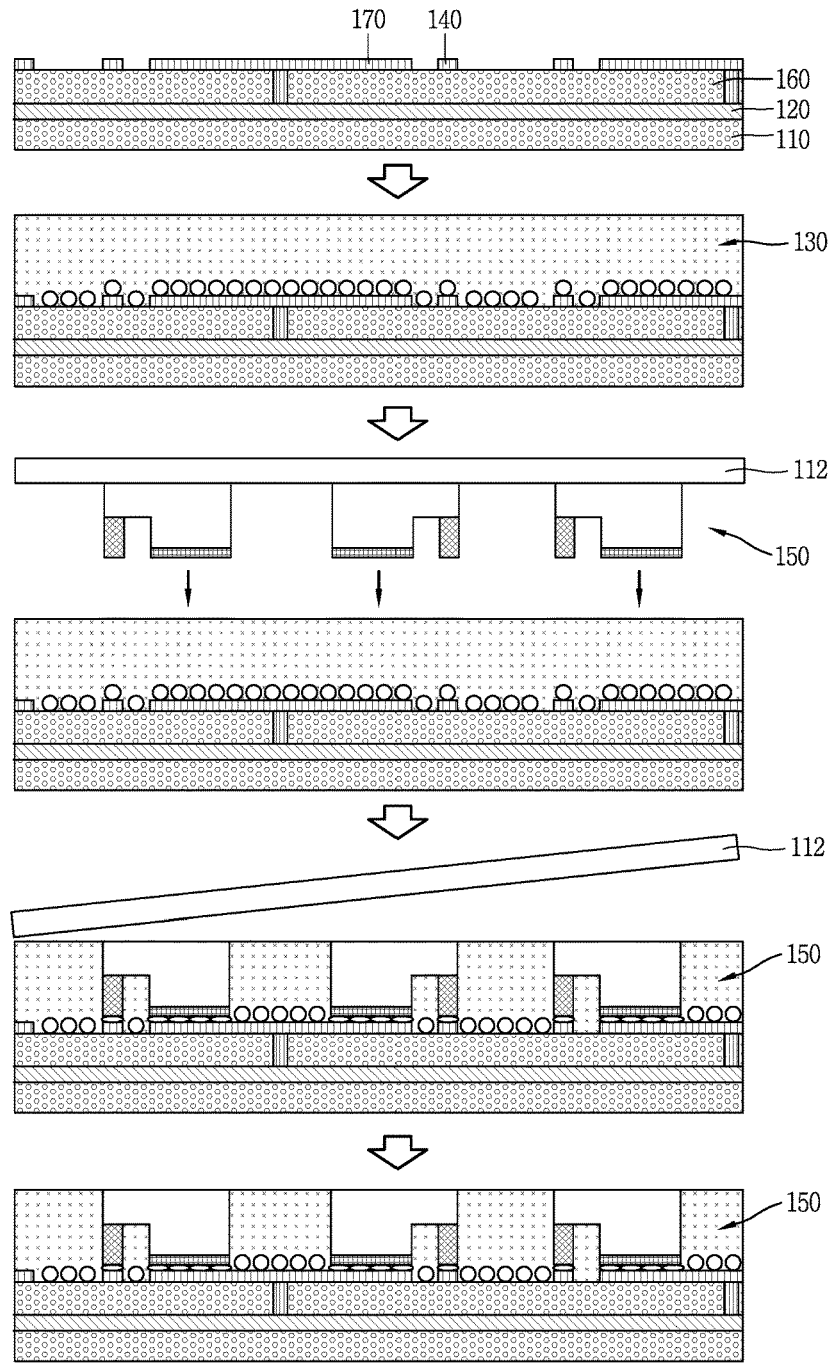
FIG. 6 is cross-sectional views illustrating a fabrication method of a display device using a semiconductor light emitting device according to the present disclosure.

A display device using the foregoing semiconductor light emitting device will be fabricated by a new type of fabrication method. Hereinafter, the fabrication method will be described with reference to FIG. 6. In particular, FIG. 6 is cross-sectional views illustrating a method of fabricating a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and an anisotropic conductive film may be coated on a substrate located with the insulating layer 160. Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this instance, the second substrate 112 as a growth substrate for growing the semiconductor light emitting device 150 may be a sapphire substrate or silicon substrate. The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6.

Figure 7:
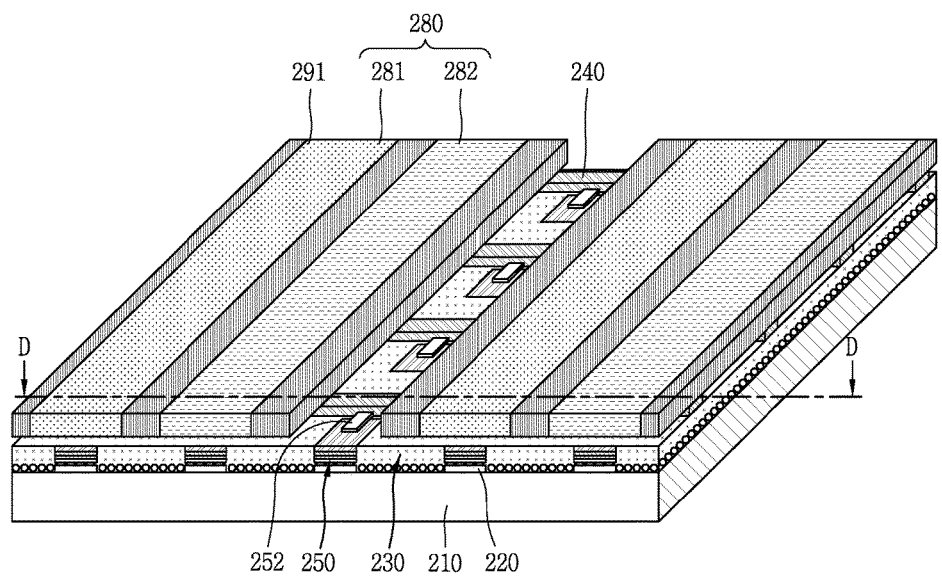
FIG. 7 is a perspective view illustrating a display device using a semiconductor light emitting device according to another embodiment of the present disclosure.
Figure 8:
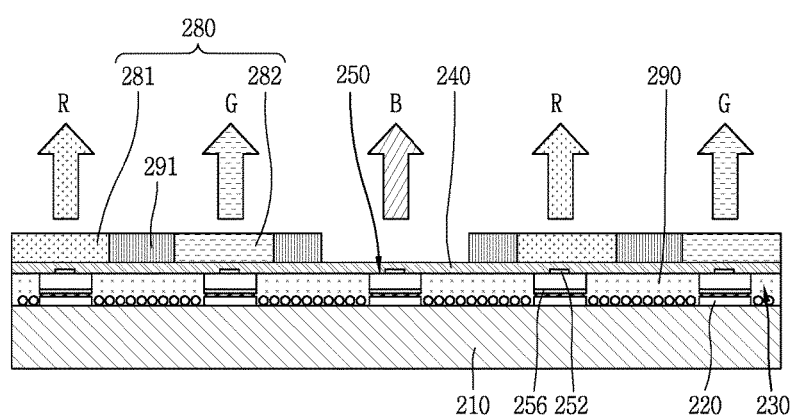
FIG. 8 is a cross-sectional view taken along line D-D in FIG. 7.
Figure 9:
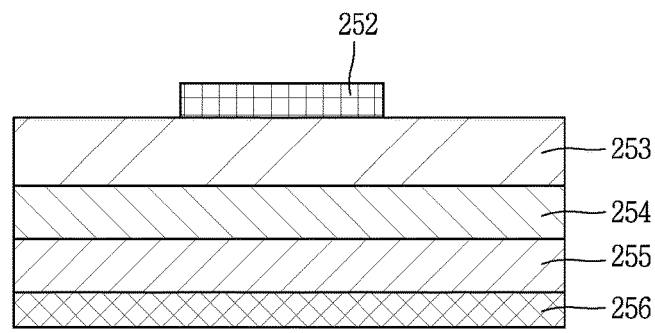
FIG. 9 is a conceptual view illustrating a vertical type semiconductor light emitting device in FIG. 8.

Furthermore, according to the following modified example or embodiment, the same or similar reference numerals are designated to the same or similar configurations to the foregoing example, and the description thereof will be substituted by the earlier description. FIG. 7 is a perspective view illustrating a display device using a semiconductor light emitting device according to another embodiment of the present disclosure. FIG. 8 is a cross-sectional view taken along line D-D in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device. The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material. The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 is preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device.

Further, the semiconductor light emitting device 250 has excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel can be provided thereon. In this instance, the phosphor layer 280 may be a red phosphor 281 and a green phosphor 282 constituting individual pixels.

In other words, a red phosphor 281 capable of converting blue light into red (R) light can be deposited on the blue semiconductor light emitting device 251 at a location implementing a red sub-pixel, and a green phosphor 282 capable of converting blue light into green (G) light can be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel. However, the present disclosure is not limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250. The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be for lied between the semiconductor light emitting devices 250. In other words, the partition wall 290 may be disposed between the vertical semiconductor light emitting devices 250 to isolate the semiconductor light emitting device 250 constituting individual pixels. In this instance, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator. In another example, a reflective partition wall may be separately provided with the partition wall 290. In this instance, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality. Furthermore, according to the drawing, a black matrix 291 may be disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

When a flip chip type is applied to a display device using the foregoing semiconductor light emitting device of the present disclosure, a first and a second electrode may be disposed on the same plane, thereby causing a problem in which it is difficult to implement a fine pitch. Hereinafter, a display device to which a flip chip type light emitting device according to another embodiment of the present disclosure is applied will be described.

Figure 10:
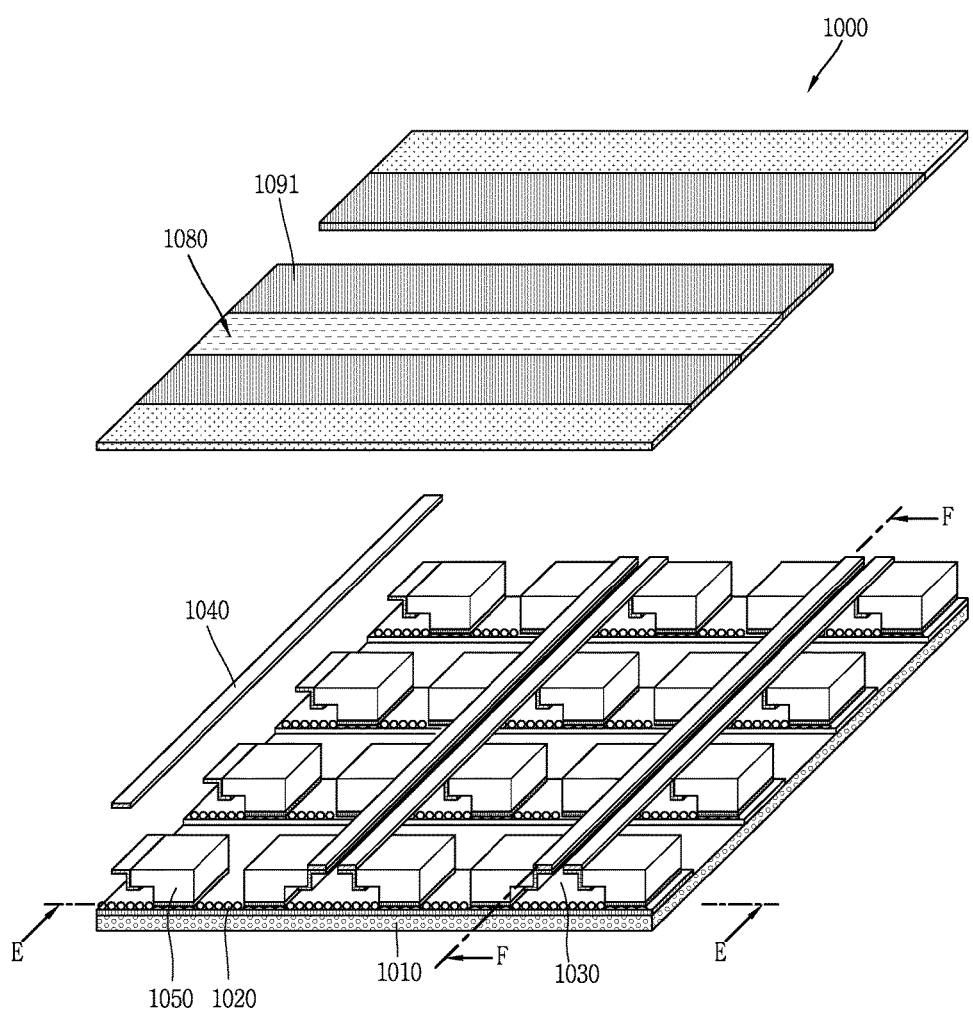
FIG. 10 is an enlarged view illustrating portion "A" in FIG. 1 illustrating another embodiment of the present disclosure to which a new type semiconductor light emitting device is applied.
Figure 11A:
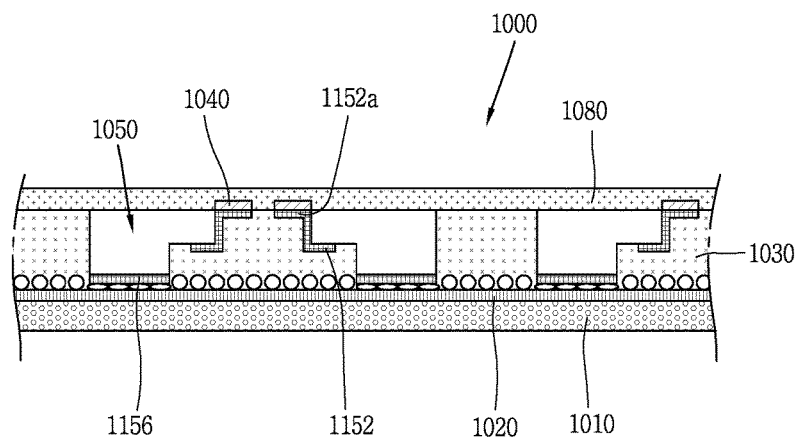
FIG. 11A is a cross-sectional view taken along line E-E in FIG. 10.
Figure 11B:
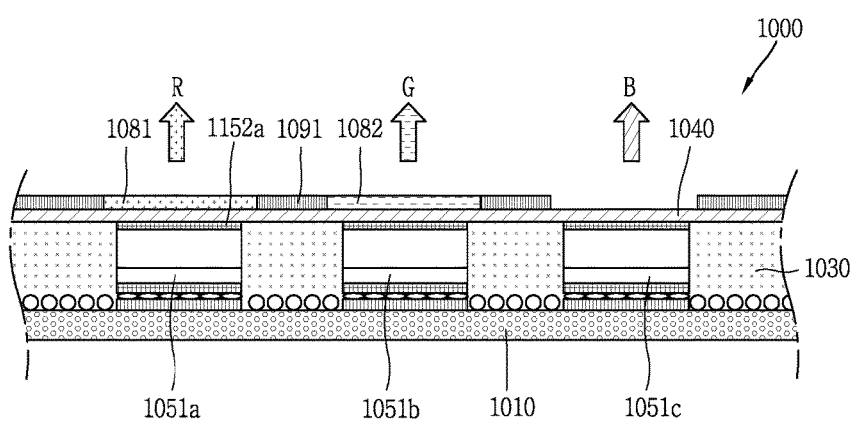
FIG. 11B is a cross-sectional view taken along line F-F in FIG. 10.
Figure 12:
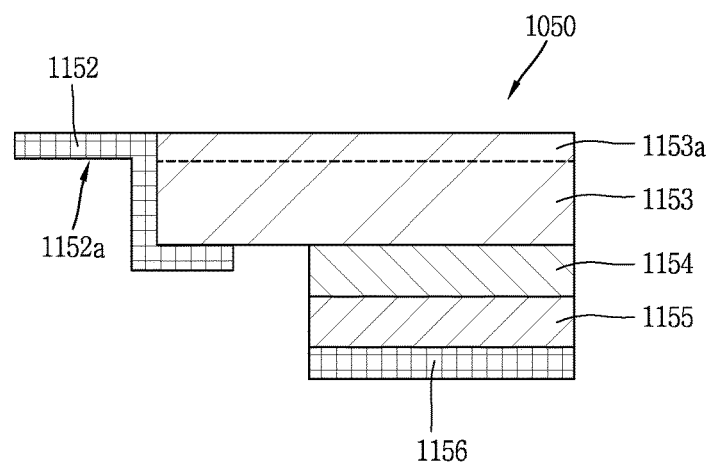
FIG. 12 is a conceptual view illustrating a flip chip type semiconductor light emitting device in FIG. 11A.

FIG. 10 is an enlarged view illustrating portion "A" in FIG. 1 illustrating another embodiment of the present disclosure to which a new type semiconductor light emitting device is applied, and FIG. 11A is a cross-sectional view taken along line E-E in FIG. 10, and FIG. 11B is a cross-sectional view taken along line F-F in FIG. 10, and FIG. 12 is a conceptual view illustrating a flip chip type semiconductor light emitting device in FIG. 11A.

According to the drawings of FIGS. 10, 11A and 11B, a display device 1000 using a passive matrix (PM) type semiconductor light emitting device is illustrated as a display device 1000 using a semiconductor light emitting device. However, an example described below may be also applicable to an active matrix (AM) type semiconductor light emitting device.

The display device 1000 may include a substrate 1010, a first electrode 1020, a conductive adhesive layer 1030, a second electrode 1040 and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexibly display device. In addition, any material may be used for the substrate 1010 if it is an insulating and flexible material. The first electrode 1020 may be located on the substrate 1010, and formed with a bar-shaped electrode elongated in one direction. The first electrode 1020 may be formed to perform the role of a data electrode.

The conductive adhesive layer 1030 is formed on the substrate 1010 located with the first electrode 1020. Similarly to a display device to which a flip chip type light emitting device is applied, the conductive adhesive layer 1030 may be an anisotropic conductive film (ACF), an anisotropic conductive paste, a solution containing conductive particles, and the like. However, according to the present embodiment, the conductive adhesive layer 1030 may be replaced by an adhesive layer. For example, when the first electrode 1020 is not located on the substrate 1010 but integrally formed with a conductive electrode of the semiconductor light emitting device, the conductivity of the adhesive layer may not be required.

A plurality of second electrodes 1040 disposed in a direction of crossing the length direction of the first electrode 1020, and electrically connected to the vertical semiconductor light emitting device 1050 may be located between the semiconductor light emitting devices.

According to the drawing, the second electrode 1040 may be located on the conductive adhesive layer 1030. In other words, the conductive adhesive layer 1030 is disposed between a wiring substrate and the second electrode 1040. The second electrode 1040 may be electrically connected to the semiconductor light emitting device 1050 through contact. According to the foregoing structure, a plurality of semiconductor light emitting devices 1050 are coupled to the conductive adhesive layer 1030, and electrically connected to the first electrode 1020 and second electrode 1040.

According to circumstances, a transparent insulating layer containing silicon oxide (SiOx) may be formed on the substrate 1010 formed with the semiconductor light emitting device 1050. When the transparent insulating layer is formed and then the second electrode 1040 is placed thereon, the second electrode 1040 may be located on the transparent insulating layer. Furthermore, the second electrode 1040 may be formed to be separated from the conductive adhesive layer 1030 or transparent insulating layer.

As illustrated in the drawing, the plurality of semiconductor light emitting devices 1050 may form a plurality of columns in a direction in parallel to a plurality of electrode lines provided in the first electrode 1020. However, the present disclosure is not limited to this. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel.

The phosphor layer 1080 may be a red phosphor layer 1081 or green phosphor layer 1082 constituting individual pixels. In other words, a red phosphor 1081 capable of converting blue light into red (R) light can be deposited on the blue semiconductor light emitting device 1051a at a location implementing a red sub-pixel, and a green phosphor 1082 capable of converting blue light into green (G) light can be deposited on the blue semiconductor light emitting device 1051b at a location implementing a green sub-pixel. Furthermore, only the blue semiconductor light emitting device 1051c may be solely used at a location implementing a blue sub-pixel. In this instance, the red (R), green (G) and blue (B) sub-pixels may implement one pixel. More specifically, one color phosphor can be deposited along each line of the first electrode 1020.

Accordingly, one line on the first electrode 1020 may be an electrode controlling one color. In other words, red (R), green (B) and blue (B) may be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels such as red (R), green (G) and blue (B).

Further, the display device may further include a black matrix 1091 disposed between each phosphor to enhance the contrast of the phosphor layer 1080. The black matrix 1091 may be formed so a gap is made between phosphor dots, and a black material fills into the gap. Through this, the black matrix 1091 may enhance the contrast between light and shade while at the same time absorbing external light reflection. The black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices may be formed at both sides by interposing a space with no the phosphor layer therebetween (or interposing the blue semiconductor light emitting device 1051*c* therebetween).

Again, referring to the semiconductor light emitting device 1050 according to the present example, for the semiconductor light emitting device 1050 in the present illustration, electrodes are disposed at the top/bottom, thereby having an advantage of reducing the chip size. However, the electrodes are disposed at both the top/bottom, but the semiconductor light emitting device of the present disclosure may be a flip chip type light emitting device.

Referring to FIG. 12, for example, the semiconductor light emitting device 1050 may include a first conductive electrode 1156, a first conductive semiconductor layer 1155 formed with the first conductive electrode 1156, an active layer 1154 formed on the first conductive semiconductor layer 1155, and a second conductive semiconductor layer 1153 formed on the active layer 1154, and a second conductive electrode 1152 formed on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and a n-type semiconductor layer, respectively. However, the present disclosure is not limited to this, and may also have an illustration in which the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode may be disposed on one surface of the second conductive semiconductor layer 1153, and an undoped semiconductor layer 1153*a* may be formed on the other surface of the second conductive semiconductor layer 1153.

Referring to FIG. 12 along with FIGS. 10 through 11B, one surface of the second conductive semiconductor layer may be a surface which is the closest to the wiring substrate, and the other surface of the second conductive semiconductor layer may be a surface which is the farthest surface from the wiring substrate. Furthermore, the first conductive electrode 1156 and second conductive electrode 1152 are formed to have a height difference in the width direction and vertical direction (or thickness direction) at a separated position along the width direction of the semiconductor light emitting device.

The second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 may be protruded along the width direction from a lateral surface of the second conductive semiconductor layer 1153 (or lateral surface of the undoped semiconductor layer 1153*a*). Thus, since the second conductive electrode 1152 is protruded from the lateral surface, the second conductive electrode 1152 may be exposed to an upper side of the semiconductor light emitting device. Through this, the second conductive electrode 1152 is disposed at a position overlapping with the second electrode 1040 disposed at an upper side of the conductive adhesive layer 1030.

More specifically, the semiconductor light emitting device may include a protrusion portion 1152*a* extended from the second conductive electrode 1152, and protruded from a lateral surface of the plurality of semiconductor light emitting devices. In this instance, based on the protrusion portion 1152*a*, it may be expressed that the first conductive electrode 1156 and second conductive electrode 1152 are disposed at a separated position along the protrusion direction of the protrusion portion 1152*a*, and formed to have a height difference from each other in a direction perpendicular to the protrusion direction.

The protrusion portion 1152*a* is extended from one surface of the second conductive semiconductor layer 1153 to a lateral surface thereof, and extended to an upper surface of the second conductive semiconductor layer 1153, more particularly, the undoped semiconductor layer 1153*a*. The protrusion portion 1152*a* is protruded along the width direction from a lateral surface of the undoped semiconductor layer 1153*a*. Accordingly, the protrusion portion 1152*a* may be electrically connected to the second electrode 1040 at an opposite side to the first conductive electrode based on the second semiconductor layer.

The structure having the protrusion portion 1152*a* may be a structure in which advantages of the foregoing horizontal semiconductor light emitting device and vertical semiconductor light emitting device can be used. Meanwhile, fine grooves may be formed by roughing on an upper surface which is the farthest from the first conductive electrode 1156 on the undoped semiconductor layer 1153*a*.

According to the foregoing display device, light emitted from semiconductor light emitting devices is excited using a phosphor to implement red (R) and green (G). Furthermore, the foregoing black matrix (191, 291, 1091 refer to FIGS. 3B, 8 and 11B) perform the role of a partition wall for preventing mixed colors between phosphors. As a result, the present disclosure presents a structure of phosphor layer capable of increasing a filling space of phosphor or a new type of partition wall structure different from the related art capable of allowing its flexibility.

Furthermore, a display device as described above has a real ppi type structure for depositing a phosphor in the same shape on each pixel to implement red, green and blue. The present disclosure presents a novel structure for implementing a display device in a pentile manner.

Figure 13:
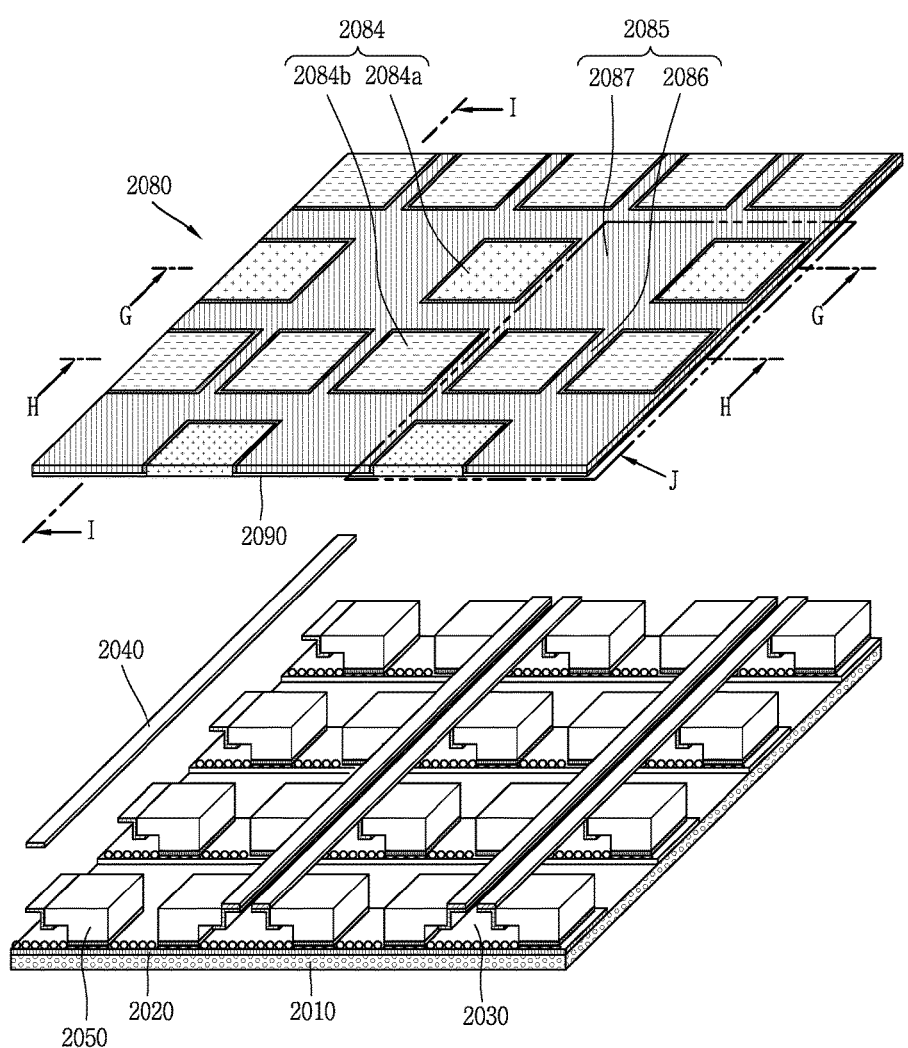
FIG. 13 is an enlarged view illustrating a portion "A" of FIG. 1 illustrating another embodiment of the present disclosure.
Figure 14A:
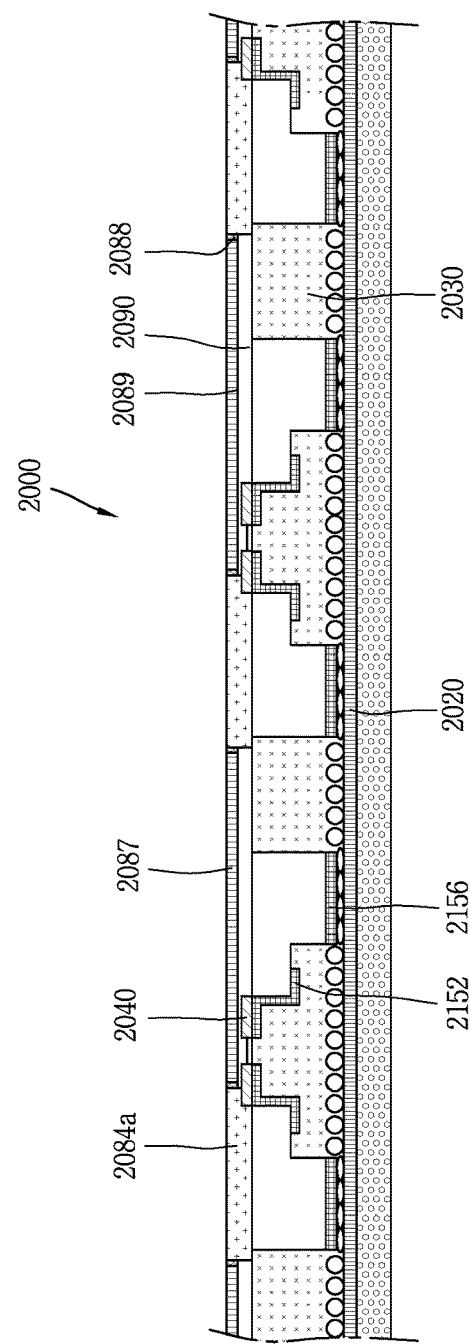
FIG. 14A is a cross-sectional view taken along line G-G in FIG. 13.
Figure 14B:
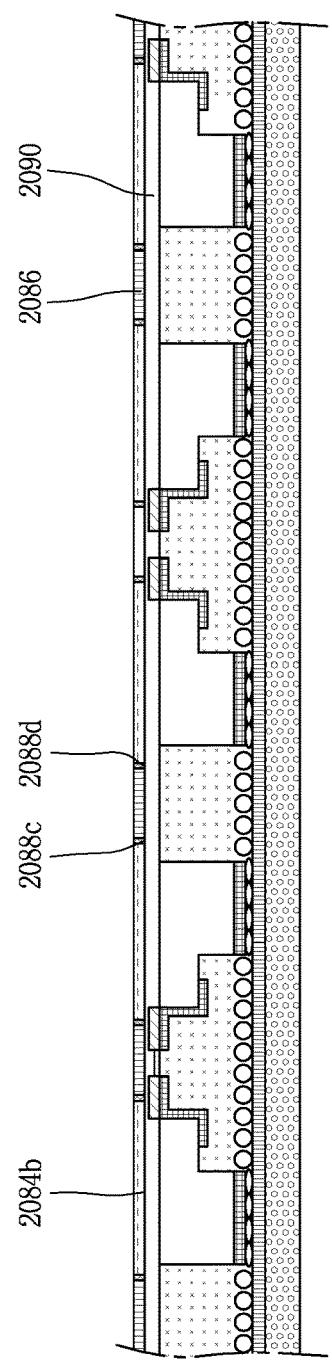
FIG. 14B is a cross-sectional view taken along line H-H in FIG. 13.
Figure 15:
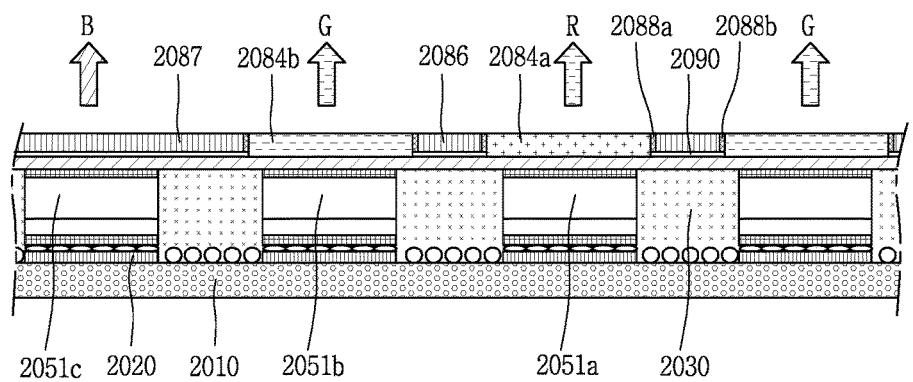
FIG. 15 is a cross-sectional view taken along line I-I in FIG. 13.
Figure 16:
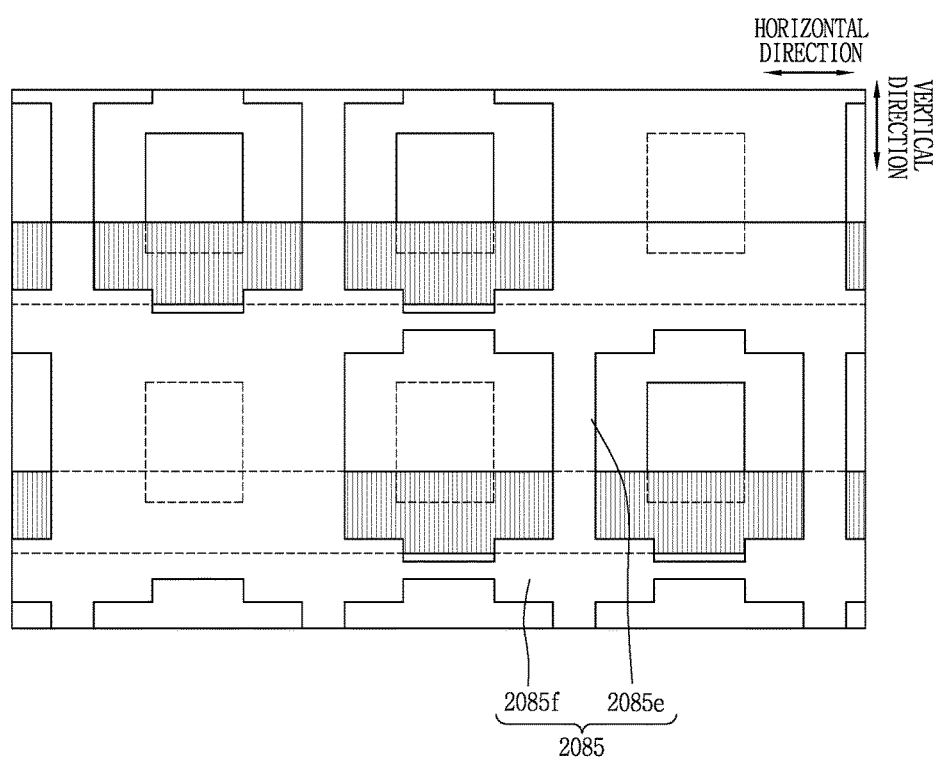
FIG. 16 is a plan view illustrating a portion "J" of FIG. 13.

Hereinafter, the structure of a pentile type display device having a novel partition wall structure will be described in more detail with reference to the accompanying drawings. In particular, FIG. 13 is an enlarged view illustrating a portion "A" of FIG. 1 illustrating another embodiment of the present disclosure, FIG. 14A is a cross-sectional view taken along line G-G in FIG. 13, FIG. 14B is a cross-sectional view taken along line H-H in FIG. 13, FIG. 15 is a cross-sectional view taken along line I-I in FIG. 13, and FIG. 16 is a plan view illustrating a portion "J" of FIG. 13.

FIGS. 13, 14A, 14B, 15 and 16 illustrate a display device 2000 using a flip chip type semiconductor light emitting device described with reference to FIGS. 10 through 12. More specifically, a novel structure of phosphor layer is applied to a flip chip type semiconductor light emitting device described with reference to FIGS. 10 through 12. However, an example which will be described below may be also applicable to a display device using the foregoing different type of semiconductor light emitting device.

According to the present example which will be described below, the same or similar reference numerals are designated to the same or similar configurations to each configuration of the foregoing example described with reference to FIGS. 10 through 12, and the description thereof will be substituted by the earlier description. For example, the display device 2000 may include a substrate 2010, a first electrode 2020, a conductive adhesive layer 2030, a second electrode 2040 and a plurality of semiconductor light emitting devices 2050, and the description thereof will substituted by the description with reference to FIGS. 10 through 12. Accordingly, according to the present embodiment, the conductive adhesive layer 2030 may be replaced by an adhesive layer, and a plurality of semiconductor light emitting devices may be adhered to an adhesive layer disposed on the substrate 2010, and the first electrode 2020 may be integrally formed with an conductive electrode of the semiconductor light emitting device without being located on the substrate 2010.

The second electrode 2040 may be located on the conductive adhesive layer 2030. In other words, the conductive adhesive layer 2030 is disposed between the wiring substrate and the second electrode 2040. The second electrode 2040 may be electrically connected to the semiconductor light emitting device 2050 by contact.

As described above, the display device 2000 may include a phosphor layer 2080 disposed to cover a plurality of semiconductor light emitting devices 2050. For example, the semiconductor light emitting device 2050 is a blue semiconductor light emitting device for emitting blue (B) light, and the phosphor layer 2080 performs a function of converting the blue (B) light into the color of a sub-pixel.

According to the drawing, the phosphor layer 2080 may include a plurality of phosphor portions 2084 for converting a wavelength of light. The plurality of phosphor portions 2084 may include a red phosphor portion 2084a provided with a red phosphor and a green phosphor portion 2084b provided with a green phosphor. The red phosphor portion 2084a capable of converting blue light into red (R) light can be deposited on the blue semiconductor light emitting device 2051a at a position implementing a red pixel, and the green phosphor portion 2084b capable of converting blue light into green (G) light can be deposited on the blue semiconductor light emitting device 2051b at a position implementing a green pixel.

Further, one partition wall portion 2085 is disposed between the red phosphor portion 2084a and the green phosphor portion 2084b. In this instance, at least one of the plurality of partition wall portions 2085 overlaps with at least one of the plurality of semiconductor light emitting devices along a thickness direction of the phosphor layer 2080. Furthermore, at least one of the plurality of partition wall portions 2085 is formed to transmit light along a thickness direction of the phosphor layer 2080. More specifically, one partition wall portion 2085 is disposed on a blue semiconductor light emitting device 2085c at a portion implementing a blue pixel to transmit light emitted from the blue semiconductor light emitting device 2051c to the outside without any conversion of the light.

In this instance, a partition wall portion corresponding to blue, a green phosphor portion, a red phosphor portion and a partition wall portion corresponding to blue may be alternately deposited to sequentially dispose a pixel emitting blue light and green light and a pixel emitting red light and green light.

A phosphor portion or partition wall portion corresponding to one color may not be formed along each line of the first electrode 2020, but a line may be an electrode for controlling one color, and another line may be a line for controlling a plurality of colors. For example, a green phosphor portion may be disposed on a line of the first electrode 2020, and a red phosphor portion and a partition wall portion corresponding to blue may be alternately disposed on another line thereof.

Furthermore, red (R), green (G) and blue (B) may be sequentially disposed along the second electrode 2040, thereby implementing a display device in which a sub-pixel shares red and blue. However, the present disclosure is not limited to this, and a quantum dot (QD) instead of a phosphor may be filled into the phosphor portion to implement a sub-pixel emitting red (R), green (G) and blue (B).

In a more specific example, the plurality of partition wall portions 2085 may include a first partition wall portion 2086 and a second partition wall portion 2087. The first partition wall portion 2086 is disposed to cover between the plurality of semiconductor light emitting devices. Accordingly, at least part of the plurality of phosphor portions 2084 is disposed by interposing the first partition wall portion 2086 therebetween. In this instance, the at least part of the plurality of phosphor portions 2084 may include at least one of a red phosphor, a green phosphor and a yellow phosphor. More specifically, the first partition wall portion 2086 is located at a portion on which a blue pixel is not disposed between the red phosphor portion 2084a and the green phosphor portion 2084b which are repeatedly formed. Accordingly, a semiconductor light emitting device is not disposed below the first partition wall portion 2086.

Further, the second partition wall portion 2087 is disposed to cover at least one of the plurality of semiconductor light emitting devices. In this instance, at least one of the plurality of semiconductor light emitting devices covered by the second partition wall portion 2087 may include a blue semiconductor light emitting device 2051c. In other words, the second partition wall portion 2087 is located at a portion on which a blue pixel is disposed in a space between the red phosphor portion 2084a and the green phosphor portion 2084b which are repeatedly formed. Accordingly, the blue semiconductor light emitting device 2051c is disposed below the second partition wall portion 2087.

In order to implement the foregoing structure, the first partition wall portion 2086 and the second partition wall portion 2087 can be disposed one by one, respectively, within a sub-pixel emitting red (R), green (G) and blue (B). Furthermore, the first partition wall portion 2086 and the second partition wall portion 2087 can be formed in different sizes of width along a direction perpendicular to a thickness direction of the phosphor layer 2080.

In this instance, the first partition wall portion 2086 is configured to have a smaller size of the width than that of the second partition wall portion 2087. A width of the second partition wall portion 2087 is configured to be equal to or larger than that of the semiconductor light emitting device 2050, and accordingly, a width of the first partition wall portion 2086 may be formed to be smaller than that of the semiconductor light emitting device 2050.

More specifically, a width of the second partition wall portion 2087 may be a size of 70 to 135% of a pitch between pixels. This is because a light emitting region of the red and green pixels may be insufficiently secured if the second partition wall portion 2087 is too large, and a light interference between the blue and red pixels or the blue and green pixels may occur if the second partition wall portion 2087 is too small.

In addition, a width of the first partition wall portion 2086 may be a size of 10 to 40% of a pitch between pixels. For example, when the pitch is 30 micrometers, a width of the first partition wall portion 2086 may be formed to be less than 10 micrometers. It is to sufficiently secure a light emitting area thereof.

According to the drawing, a width of the phosphor portion 2084 may be configured to be larger than that of the semiconductor light emitting device 2050. In addition, only two partition wall portions may exist within a sub-pixel, and a width of one (for example, first partition wall portion) of the two partition wall portions may decrease, thereby further increasing a width of the phosphor portion 2084. Thus, the width of the phosphor portion 2084 may increase to further secure a filling space of the phosphor portion compared to the related art, thereby further increasing an amount of phosphor filled therein. In this instance, a phosphor particle size filled into the phosphor portion may be 3 to 15 micrometers.

In addition, the plurality of partition wall portions are sequentially disposed between the phosphor portions along a first and a second direction, respectively, crossing each other. Thus, it is possible to prevent the leakage of light both in a vertical direction (corresponding to the first direction) and a horizontal direction (corresponding to the second direction). Furthermore, at least one of the sequentially disposed partition wall portions overlap with at least one of the plurality of semiconductor light emitting devices. Through this, a novel partition wall structure in horizontal and vertical directions is applicable to a pentile type display device.

Here, the first partition wall portion 2086 and second partition wall portion 2087 may be formed in different sizes of width formed along the horizontal and vertical directions. For example, the second partition wall portion 2087 for transmitting blue light may be formed in different widths in vertical and horizontal directions. According to the drawing, it is illustrated that a width in a vertical direction is larger than that in a horizontal direction.

Further, the first partition wall portion 2086 and second partition wall portion 2087 may be formed so pixels are disconnected one by one. Thus, in case of a connected space, it is possible to alleviate or prevent light from being guided and interfered with other pixels.

Furthermore, according to the drawing, an anti-reflection coating layer 2090 for reducing reflectivity may be formed on a bottom surface of the plurality of partition wall portions. The anti-reflection coating layer 2090 may include a non-conductive material, thereby allowing it to insulated between the second electrode 2040 and the partition wall portion.

More specifically describing the structure of the partition wall portions 2085, the plurality of partition wall portions are formed to fill a light transmitting material into a space surrounded by metal thin films 2088. For example, the plurality of partition wall portions 2085 include one or more metal thin films 2088 formed at an edge thereof, and are formed to fill a light transmitting material 2089 between the metal thin films 2088.

As a material having a high transmittance in a visible light region, an epoxy-based photoresist (PR), polydimethylsiloxane (PDMS), resin or the like may be used for the light transmitting material 2089, for example. The materials are suitable for the material of the partition wall portion applied to a flexible display since they do not have hardening properties at high temperatures.

The second partition wall portion 2087 covers the blue semiconductor light emitting device, and thus the light transmitting material 2089 overlaps with the blue semiconductor light emitting device at a portion corresponding to a blue pixel. In this instance, the light transmitting material 2089 overlapping with the blue semiconductor light emitting device may be disposed between the green phosphor portions along either one of the first and the second direction, and disposed between the red phosphor portions along the other one thereof. According to the present example, the light transmitting material 2089 overlapping with the blue semiconductor light emitting device is disposed between the green phosphor portions in a horizontal direction, and disposed between the red phosphor portions in a vertical direction.

Further, the plurality of partition wall portions may have at least an inclined plane, respectively, and the metal thin films can be provided on planes, respectively, sequentially disposed along at least one of horizontal and vertical directions. For example, each phosphor portion may be surrounded by metal thin films along horizontal and vertical directions.

Furthermore, the metal thin films 2088 may be formed to cover a lateral surface of the phosphor portions 2084 to reflect light. According to such a structure, all four surfaces of the red or green phosphor portion may be coated with a metal thin film.

The metal thin films 2088 may include a first metal thin film 2088a and a second metal thin film 2088b disposed at a pair of edges of the partition wall portions 2085 in a horizontal direction. Furthermore, the metal thin films 2088 may include a third metal thin film 2088c and a fourth metal thin film 2088d disposed at a pair of edges of the partition wall portions 2085 in a vertical direction.

The metal thin films 2088 may have a thickness of 50 to 1000 nanometers, respectively. More specifically, the first metal thin film 2088a, second metal thin film 2088b, third metal thin film 2088c and fourth metal thin film 2088d may be formed with 100 to 200 nanometers, respectively. The metal thin films 2088 may not exist at an upper and lower end of the partition wall portion. Thus, light passing through a light transmitting material can be emitted to the outside from an upper end of the partition wall portion.

The first metal thin film 2088a, second metal thin film 2088b, third metal thin film 2088c and fourth metal thin film 2088d are formed of a metal material such as aluminum, silver or the like having a high reflectivity in a visible light region to reflect light, thereby preventing color mixture between phosphor portions. However, the present disclosure is not limited to this, and for example, the metal thin film may be replaced with an oxide thin film such as TiOx, CrOx or the like, or a distributed Bragg reflector (DBR) structure may be applicable thereto.

Figure 18A:
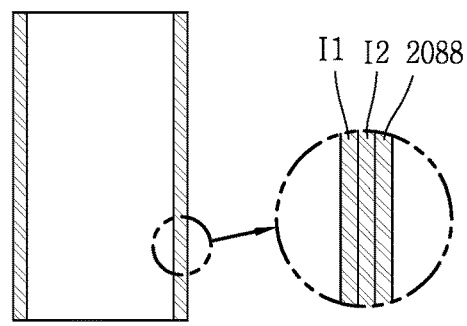
FIGS. 18A and 18B are cross-sectional views illustrating the modification examples of partition wall portions in FIG. 15, respectively.

The metal thin films 2088 may be formed with a single metal thin film as illustrated in the drawing, but the present disclosure is not limited to this. For example, the metal thin films 2088 may be formed with a multilayer thin film as illustrated in FIG. 18A. In particular, FIGS. 18A and 18B are cross-sectional views illustrating the modification examples of partition wall portions in FIG. 15, respectively.

As illustrated in the drawing, metal thin films (I1, I2) with another material for enhancing oxidation protection and adhesiveness may be formed on one surface of the metal thin film 2088. In this instance, titanium, nickel, chrome or the like may be used for another material.

Figure 18B:
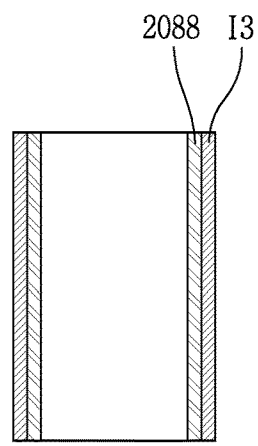

In another example, as illustrated in FIG. 18B, an insulating film (I3) may be formed between the metal thin film 2088 and the light transmitting material. The insulating film (I3) may be formed of a non-transparent material, and SiO2, SiNx or the like may be used For example. For still another example, the insulating film (I3) may be a black matrix. In this instance, the black matrix may exert an additional effect of resulting in the enhancement of contrast.

Referring to FIG. 16 again, at least one of the plurality of partition wall portions 2085 may include a first portion 2085e and a second portion 2085f. The metal thin film 2088 may be disposed at an edge of the plurality of partition wall portions 2085, and thus the metal thin film 2088 may include a first portion 2088e and a second portion 2088f similarly to the partition wall portions 2085.

The first portion 2085e is extended along a first direction (vertical direction), and the second portion 2085f is protruded from an end portion of the first portion 2085e in a second direction (horizontal direction) perpendicular to the first direction. Through such a structure, the partition wall portions are connected to each other while surrounding the semiconductor light emitting devices, respectively.

In another example, referring to FIGS. 17A, 17B, 17C, 17D and 17E, at least one of the plurality of partition wall portions 2085 may be separated from an adjoining partition wall portion along the first direction or the second direction. FIGS. 17A, 17B, 17C, 17D and 17E are plan views illustrating the modification examples of partition wall portions in FIG. 16.

Figure 17A:
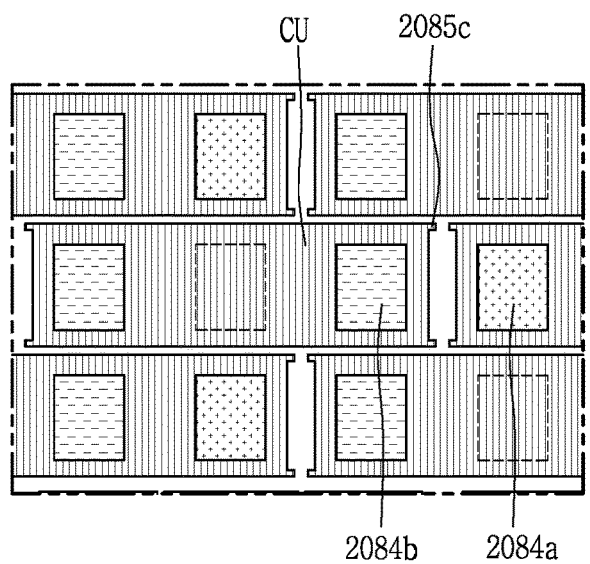
FIGS. 17A, 17B, 17C, 17D and 17E are plan views illustrating the modification examples of partition wall portions in FIG. 16.

Through the partial separation, it is possible to secure flexibility from a display device. For example, as illustrated in FIG. 17A, it may be a closed structure disconnected in a cell unit in which partition wall portions are disconnected from each other in the cell unit (a unit containing three semiconductor light emitting devices, CU), and closed in one cell. In the cell unit (CU), a partition wall portion corresponding to blue may be disposed between green phosphor portions 2084b or partition wall portions corresponding to the green phosphor portion 2084b, red phosphor portion 2084a, and blue may be all disposed thereon.

According to the drawing, in order to enhance rigidity, a protrusion portion 2085c may be protruded from a position at which the first portion and the second portion intersect each other. Furthermore, the protrusion portion 2085c may be protruded from a partition wall portion located at an edge of the cell unit. In this instance, the foregoing structure described with reference to FIGS. 13, 14A, 14B and 15 may be a closed structure connected in a cell unit.

Figure 17B:
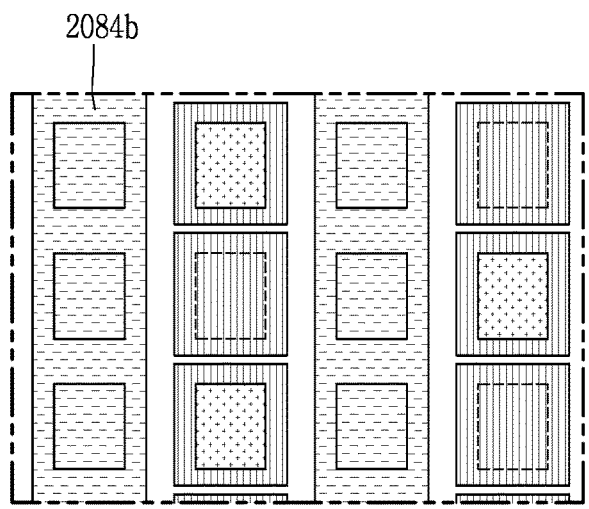

In another example, a structure with no partition wall in a vertical direction between the same color pixels may be also used as illustrated in FIG. 17B. More specifically, the green phosphor portions 2084b may be connected to each other with no partition wall along a vertical direction, namely, a direction from which the second electrode is extended.

Figure 17C:
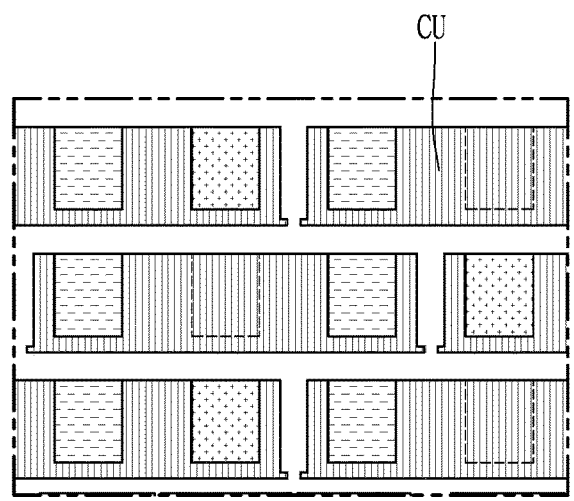
Figure 17D:
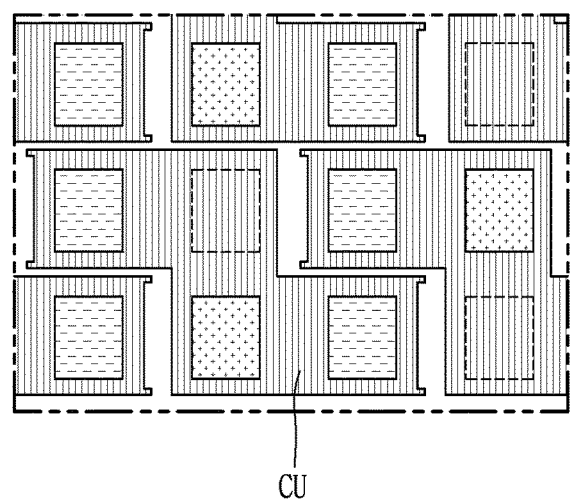

In still another example, an open structure disconnected in a cell unit may be also used as a structure in which partition wall portions are disconnected in a cell unit (CU), and part thereof are not disposed within a cell as illustrated in FIG. 17C. According to the drawing, there is no partition wall at an upper side along a vertical direction in the cell unit (CU), and thus part thereof are open in the cell unit (CU). Further, a non-symmetric structure connected in a cell unit (CU) or the like may be also used as illustrated in FIG. 17D.

Thus, according to the present disclosure, the partition wall portions may be used for various structures such as forming a closed structure connected to each other or forming one side protrusion structure in which only one side of adjoining partition wall portions is formed to block the one side, and the like. Furthermore, the present disclosure may enhance a degree of design freedom for securing both flexibility and rigidity through a structure in which partition wall portions are separated from each other but part thereof are connected to each other.

Figure 17E:
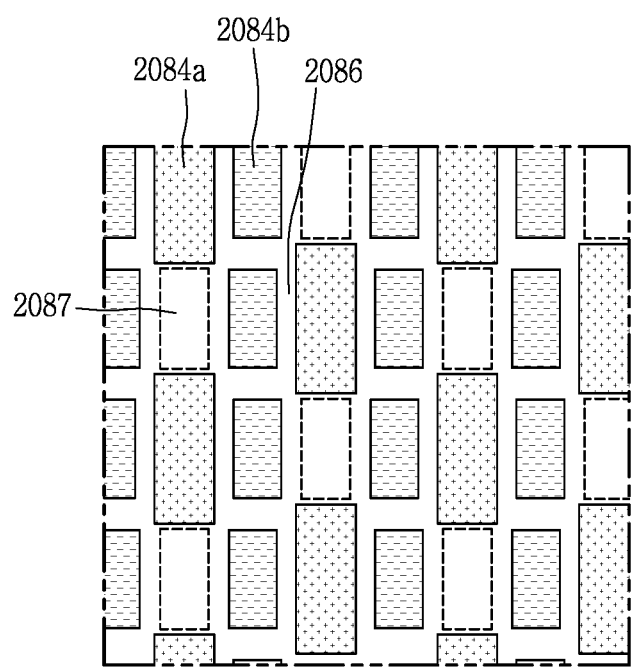

In another example, as illustrated in FIG. 17E, sizes of width of the partition wall portions corresponding to each sub-pixel may be different from each other. For example, the partition wall portions and phosphor portions may be coupled to each other to form a honeycomb shape, but sizes of each chamber in the honeycomb shape may be different from each other.

More specifically, a width of the first partition wall portion 2086 and second partition wall portion 2087 may vary in a horizontal direction or vertical direction, respectively. Through this, according to the present disclosure, sizes for each region of red (R), green (G) and blue (B) may be different.

For example, the second partition wall portion 2087 corresponding to blue, green phosphor portion 2084b and red phosphor portion 2084a may be formed to have different sizes from each other. As illustrated in the drawing, a size of the red phosphor portion 2084a and the second partition wall portion 2087 corresponding to blue may be larger than that of the green phosphor portion 2084b. Alternatively, it may gradually decrease in the order of the red phosphor portion 2084a, the second partition wall portion 2087 corresponding to blue and the green phosphor portion 2084b in their sizes, and sizes for each region of red (R), green (G) and blue (B) may be different.

Furthermore, a change of the size may be implemented by varying the length of the phosphor portion or partition wall portion along a vertical direction. In this instance, the red phosphor portion 2084a and the second partition wall portion 2087 corresponding to blue may be larger than the green phosphor portion 2084b in the length of the vertical direction. In another example, the length of the vertical direction is the largest in the red phosphor portion 2084a, and decreases in the order of the second partition wall portion 2087 corresponding to blue and the green phosphor portion 2084b. However, the present disclosure is not limited to this, and the length of the horizontal direction may be also changed.

According to a new phosphor layer structure as described above, it is possible to implement a partition wall portion suitable to a display having flexible characteristics. Hereinafter, a method of fabricating a new phosphor layer structure as described above will be described in more detail with reference to the accompanying drawings. FIGS. 19A, 19B, 19C, 20A, 20B, 20C, 20D and 20E are cross-sectional views illustrating a fabrication method of a display device using a semiconductor light emitting device of the present disclosure, and FIG. 21 is a conceptual view illustrating the concept of depositing a metal thin film in FIG. 20B.

Figure 19A:
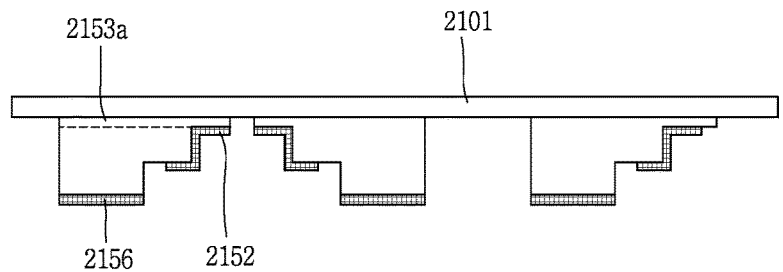
FIGS. 19A, 19B, 19C, 20A, 20B, 20C, 20D and 20E are cross-sectional views illustrating a fabrication method of a display device using a semiconductor light emitting device of the present disclosure.
Figure 19B:
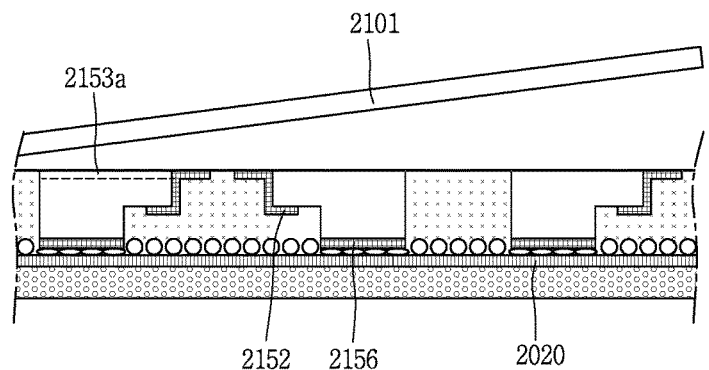
Figure 19C:
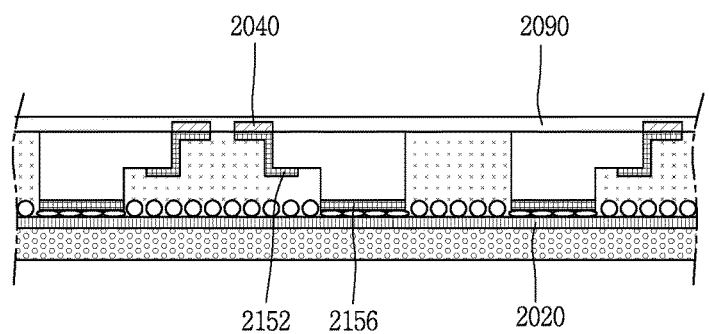
Figure 20A:
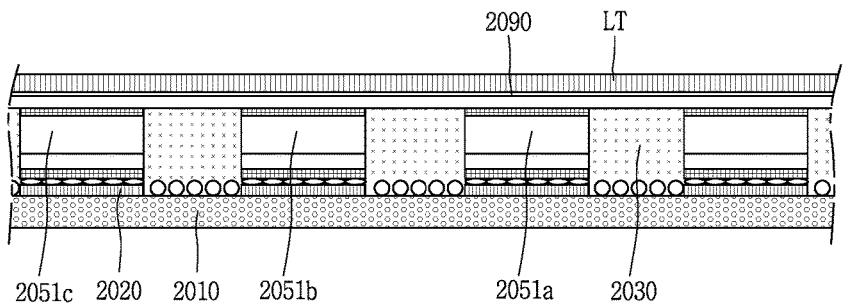
Figure 20B:
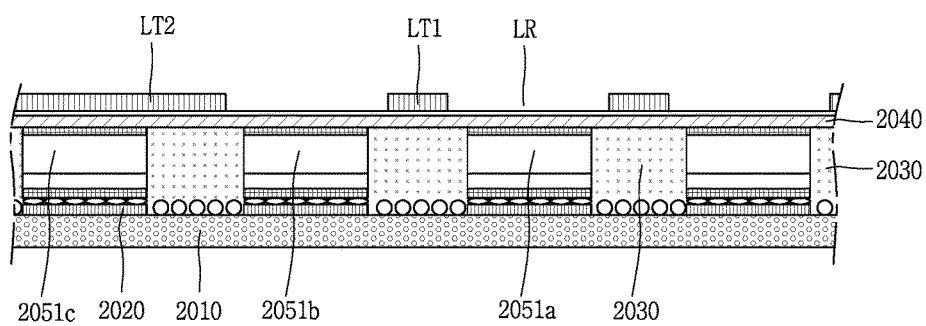

FIGS. 19A, 19B and 19C are views illustrating a fabrication method of a display device using a semiconductor light emitting device of the present disclosure with reference to cross-sectional views seen in a direction of G-G in FIG. 13, and FIGS. 20A, 20B, 20C, 20D and 20E are views illustrating a fabrication method of a display device using a semiconductor light emitting device of the present disclosure with reference to cross-sectional views seen in a direction of H-H in FIG. 13.

First, according to the fabrication method, the process of coupling a plurality of semiconductor light emitting devices to a substrate is performed. For example, For example, a first conductive semiconductor layer, an active layer and a second conductive semiconductor layer are grown on a growth substrate, and each semiconductor light emitting device is created through etching, and then a first conductive electrode 2156 and a second conductive electrode 2152 are formed (FIG. 19A).

The growth substrate 2101 (wafer) may be formed of a material having light transmitting properties such as any one of sapphire (Al2O3), GaN, ZnO and AlO, but is not limited to this. Furthermore, the growth substrate 2101 may be formed of a material suitable to semiconductor material growth, carrier wafer. The growth substrate 2101 may be formed of a material having a high thermal conductivity, and use a SiC substrate having a thermal conductivity higher than that of the sapphire substrate (Al2O3) or at least one of Si, GaAs, GaP, InP and Ga2O3 including a conductive substrate or insulating substrate.

The first conductive electrode 2156 and first conductive semiconductor layer may be a p-type electrode and a p-type semiconductor layer, respectively, and the second conductive electrode 2152 and second conductive semiconductor layer may be an n-type electrode and an n-type semiconductor layer, respectively. However, the present disclosure is not limited to this, and may also have an illustration in which the first conductive type is an n-type and the second conductive type is a p-type.

In this instance, as described above, at least part of the second conductive electrode 2152 is protruded from a lateral surface of the second conductive semiconductor layer (or a lateral surface of the undoped semiconductor layer 2153a). Next, the flip chip type semiconductor light emitting device is coupled to a wiring substrate suing the conductive adhesive layer 2030, and the growth substrate is removed (FIG. 19B).

The wiring substrate is when the first electrode 2020 is formed thereon, and the first electrode 2020, as a lower wiring layer, is electrically connected to the first conductive electrode 2156 by a conductive ball or the like within the conductive adhesive layer 2030.

Then, the undoped semiconductor layer 2153a is etched and removed, and then the second electrode 2040 connected to the protruded second conductive electrode 2152 is formed (FIG. 19C). As an upper wiring layer, the wiring line may be directly connected to the second conductive electrode 2152.

However, the present disclosure is not limited to this, and the undoped semiconductor layer may be replaced by another type of absorption layer for absorbing UV laser. The absorption layer may be a buffer layer, and formed in a low temperature atmosphere, and formed of a material capable of alleviating a lattice constant difference between the semiconductor layer and the growth substrate. For example, the absorption layer may include a material such as GaN, InN, AlN, AlInN, InGaN, AlGaN, and InAlGaN.

Furthermore, the anti-reflection coating layer 2090 for reducing reflectivity is coated to cover semiconductor light emitting devices formed by the process. In other words, the process of forming the anti-reflection coating layer 2090 between the plurality of semiconductor light emitting devices and a light transmitting material which will be described later is performed. The anti-reflection coating layer 2090 may include a non-conductive material, and for example, the non-conductive material may be coated to cover the second electrode 2040 on one surface of the conductive adhesive layer. Through such a structure, an insulating structure to the second electrode 2040 and partition wall portion may be implemented.

Next, a phosphor layer disposed to cover the plurality of semiconductor light emitting devices is formed. The phosphor layer may include a plurality of phosphor portions for converting the wavelength of light and a plurality of partition wall portions formed between the plurality of phosphor portions. In this instance, at least one of the plurality of partition wall portions may overlap with at least one of the plurality of semiconductor light emitting devices along a thickness direction of the phosphor layer.

According to the drawing, first, the process of forming a partition wall portion may be performed. Referring to FIG. 20A, the light transmitting material (RT) is coated on the plurality of semiconductor light emitting device. As a material having a high transmittance in a visible light region, as described above, an epoxy-based photoresist (PR), polydimethylsiloxane (PDMS), resin or the like may be used for the light transmitting material (RT).

Then, the process of etching the light transmitting material (RT), and filling a phosphor into a portion (LR) from which the light transmitting material (RT) is etched to create the phosphor portions is performed. More specifically, referring to FIG. 20B, the light transmitting material (RT) is etched, and in this instance, the light transmitting material (RT) is non-etched on a portion corresponding to at least one of the plurality of semiconductor light emitting devices. In other words, due to the etching, the light transmitting material (RT) may be partitioned into a portion (LT1) disposed to cover between the plurality of semiconductor light emitting devices and a portion (LT2) disposed to cover at least one of the plurality of semiconductor light emitting devices.

In this instance, the plurality of partition wall portions may be etched to be sequentially disposed between the phosphor portions along vertical and horizontal directions crossing each other, respectively. Furthermore, the plurality of partition wall portions may be etched in a shape including a first portion, a second portion and a protrusion portion. For example, the etched light transmitting material may include a second portion or protrusion portion protruded from an end portion of the first portion to hide at least part of the light transmitting material along a deposition direction of the metal thin film.

Figure 20C:
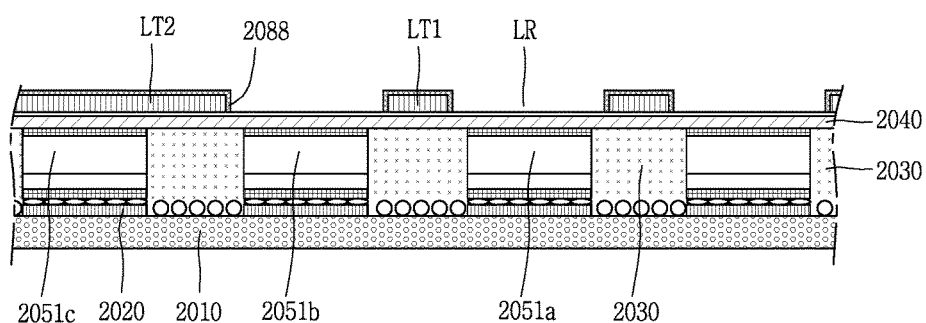
Figure 20D:
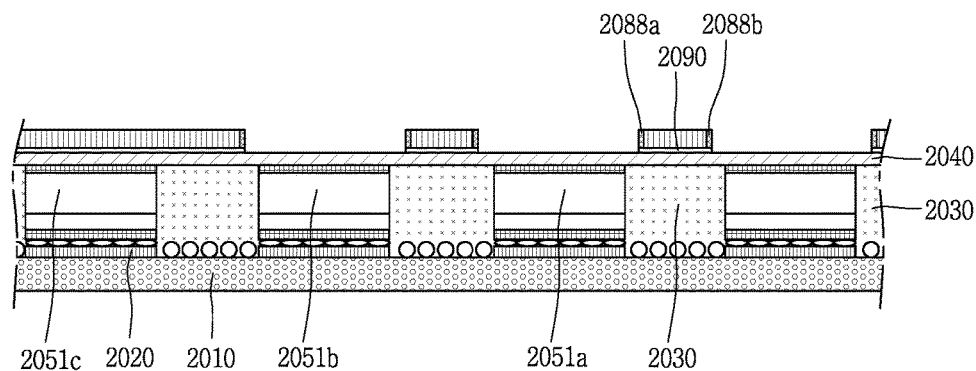
Figure 21:
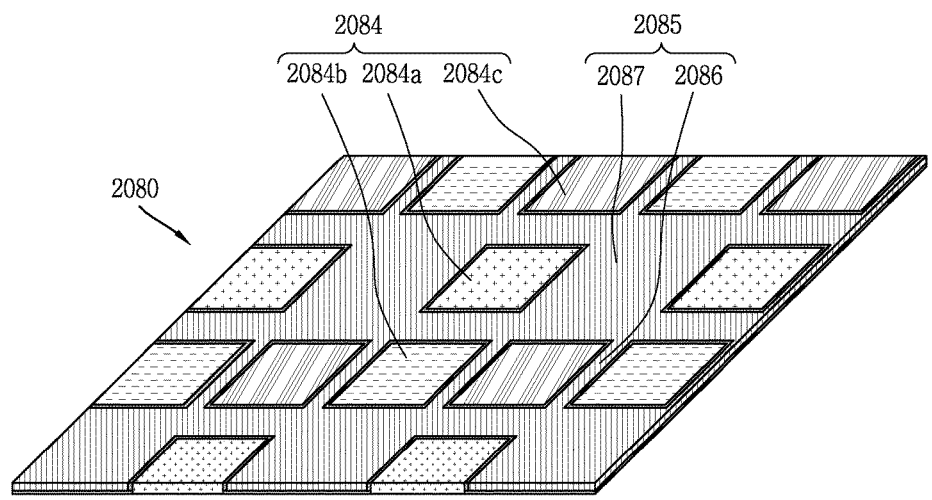
FIGS. 21 and 22 are conceptual views illustrating other examples of the present disclosure.

Referring to FIG. 20C, the process of etching the light transmitting material, and then depositing the metal thin film 2088 on the light transmitting material (RT) is performed.

Through this, it may be performed to surround a portion from which the light transmitting material is non-etched by the metal thin film.

In this instance, the metal thin films 2088 can be deposited on an entire outer surface of the light transmitting material (RT) using a deposition technology or sputter. The metal thin film may be formed of a metal material such as such as aluminum, silver or the like having a high reflectivity in a visible light region as described above.

Here, when a metal thin film is deposited using a facility using a well-known principle, it is possible to adjust a deposition level on an inner lateral surface through a predetermined height and width ratio. Then, at least part of the metal thin film is removed to transmit light emitted from the semiconductor light emitting device to a portion corresponding to at least one of the plurality of semiconductor light emitting devices (refer to FIG. 20D).

For example, a metal thin film may be removed from an upper surface (a surface which is the farthest from the semiconductor light emitting device) of the partition wall portion, and in this case an upper portion of the metal thin film may be removed by dry etching to minimize an effect on the semiconductor light emitting device. Furthermore, at this time, an anti-reflection coating layer may be removed from a region excluding the partition wall portions. According to the process, an anti-reflection coating layer for reducing reflectivity may be formed only on a bottom surface of the plurality of partition wall portions.

Figure 20E:
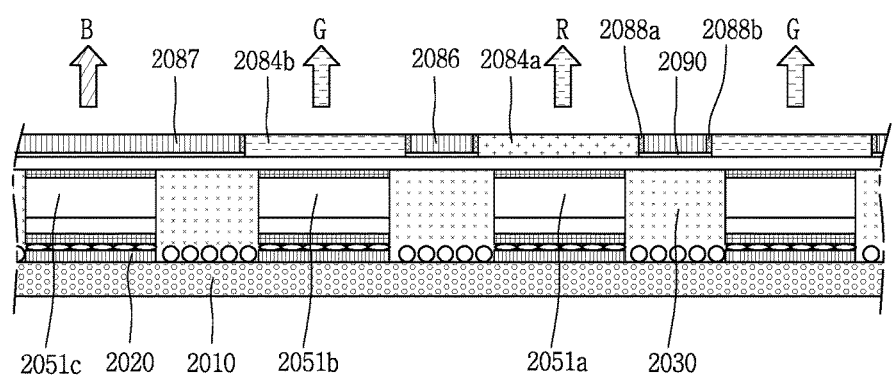

Next, as illustrated in FIG. 20E, a phosphor is filled between the light transmitting materials deposited with the metal thin films to create the phosphor portion. For an example of creating the phosphor portion, first, a method of coating and developing a photoresist and then sequentially coating a red phosphor and a green phosphor may be used.

In another example, a method of filling a yellow phosphor between the light transmitting materials deposited with the metal thin films, and then adhering a color filter repeated with red, green and blue thereto may be used. In this instance, the phosphor portion may be combined with the color filter to implement red, green and blue sub-pixels.

In the above, the configuration of the present disclosure has been described based on a case where a green phosphor portion is disposed on a line of the first electrode 2020 arranged along a vertical direction, and a red phosphor portion and a partition wall portion corresponding to blue are alternately disposed on another line thereof. The present disclosure is not limited to this, and the arrangement of phosphor portions may be modified in various ways. Hereinafter, such a modified example will be described with reference to FIGS. 22A and 22B.

Figure 22:
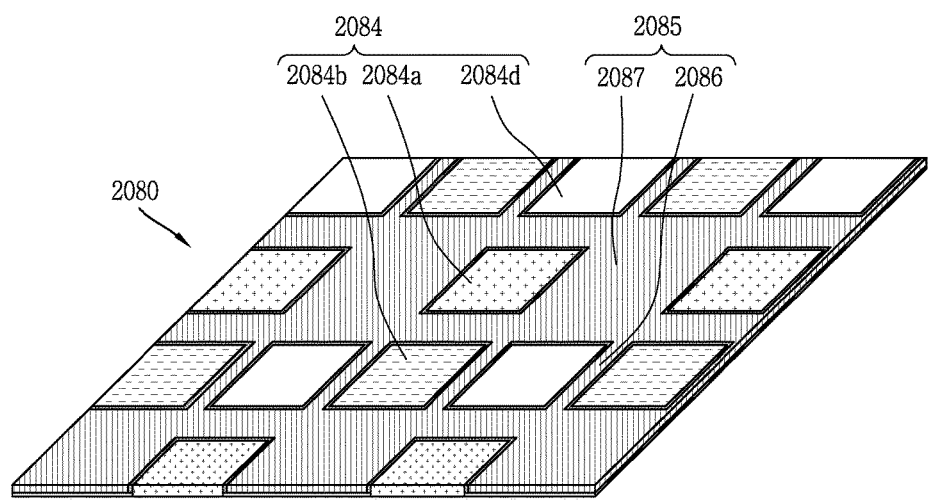

FIGS. 21 and 22 are conceptual views illustrating other examples of the present disclosure. Referring to FIG. 21, part of the green phosphor portion 2084b may be replaced by the yellow phosphor portion 2084c in the foregoing example with reference to FIGS. 13 through 18B.

Specifically, the light transmitting material may be disposed between the green phosphor portions 2084b and the yellow phosphor portions 2084c along either one of the first and the second direction, and disposed between the red phosphor portions 2084a along the other one thereof. For example, the green phosphor portion 2084b and the yellow phosphor portion 2084c may be alternately disposed on a line of the first electrode 2020, and the red phosphor portion 2084a and a partition wall portion corresponding to blue may be alternately disposed on another line thereof.

According to such an arrangement, it allows a structure in which a red, a green, a blue, and a yellow phosphor portion are arranged at a first column in a horizontal direction, and a blue, a yellow, a red and a green phosphor portion are arranged at the next column. In another example, referring to FIG. 22, in the foregoing example with reference to FIGS. 13 through 18B, part of the green phosphor portion 2084b may be replaced by a white phosphor portion 2084d.

Specifically, the light transmitting material may be disposed between the green phosphor portions 2084b and the white phosphor portions 2084d along either one of the first and the second direction, and disposed between the red phosphor portions 2084a along another one thereof. For example, the green phosphor portion 2084b and the white phosphor portion 2084d may be alternately disposed on a line of the first electrode 2020, and the red phosphor portion 2084a and a partition wall portion corresponding to blue may be alternately disposed on another line thereof.

According to such an arrangement, it allows a structure in which a red, a green, a blue, and a white phosphor portion are arranged at a first column in a horizontal direction, and a blue, a white, a red and a green phosphor portion are arranged at the next column.

The present invention encompasses various modifications to each of the examples and embodiments discussed herein. According to the invention, one or more features described above in one embodiment or example can be equally applied to another embodiment or example described above. The features of one or more embodiments or examples described above can be combined into each of the embodiments or examples described above. Any full or partial combination of one or more embodiment or examples of the invention is also part of the invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:
1. A display device, comprising:
a substrate including a wiring electrode;
an adhesive layer disposed on the substrate;
a plurality of semiconductor light emitting devices adhered to the adhesive layer, and electrically connected to the wiring electrode; and
a phosphor layer disposed to cover the plurality of semiconductor light emitting devices,
wherein the phosphor layer includes a plurality of phosphor portions for converting a wavelength of light, and a plurality of partition wall portions formed between the plurality of phosphor portions,
wherein the plurality of partition wall portions are sequentially disposed between the phosphor portions along a first direction and a second direction crossing each other, respectively, and at least one of the sequentially disposed partition wall portions overlaps with at least one of the plurality of semiconductor light emitting devices,
wherein the phosphor portions comprise red phosphor portions and green phosphor portions,
wherein the plurality of partition wall portions comprise a first partition wall portion disposed to cover between the plurality of semiconductor light emitting devices and a second partition wall portion disposed to cover at least one of the semiconductor light emitting devices, and wherein the red phosphor portions are larger than the green phosphor portions and the second partition wall portion.

2. The display device of claim 1, wherein the plurality of partition wall portions include a light transmitting material in a space surrounded by metal thin films.

3. The display device of claim 2, wherein the plurality of partition wall portions have at least an inclined plane, respectively, and the metal thin films are provided on planes, respectively, sequentially disposed along at least one of the first and the second direction.

4. The display device of claim 2, wherein the metal thin films cover a lateral surface of the phosphor portions to reflect light from the metal thin film.

5. The display device of claim 2, wherein the phosphor portions further comprises yellow phosphor portions.

6. The display device of claim 5, wherein the light transmitting material is disposed between the green phosphors along either one of the first and the second direction, and disposed between the red phosphor portions along the other one thereof.

7. The display device of claim 5, wherein the light transmitting material is disposed between the green phosphor portions and the yellow phosphor portions along either one of the first and the second direction, and disposed between the red phosphor portions along the other one thereof.

8. The display device of claim 7, further comprising:
a pixel emitting blue light and green light and a pixel emitting red light and green light sequentially disposed.

9. The display device of claim 1, wherein at least one of the plurality of semiconductor light emitting devices covered by the second partition wall portion comprises a blue semiconductor light emitting device.

10. The display device of claim 1, wherein at least part of the plurality of phosphor portions is disposed by interposing the first partition wall portion therebetween, and wherein the first partition wall portion and the second partition wall portion have different sizes of width formed along the first and the second direction.

11. The display device of claim 1, wherein at least one of the plurality of partition wall portions comprises:
a first portion extended along the first direction; and
a second portion protruded from the first portion in the second direction.

12. The display device of claim 11, wherein at least one of the first and the second direction is formed to be connected to an adjoining partition wall portion.

13. The display device of claim 11, further comprising:
a protrusion portion protruded from a position at which the first portion and the second portion intersect each other.

14. The display device of claim 11, wherein at least one of the plurality of partition wall portions is separated from an adjoining partition wall portion along the first direction or the second direction.

15. The display device of claim 1, further comprising:
an anti-reflection coating layer on a bottom surface of the plurality of partition wall portions.

16. The display device of claim 15, wherein the anti-reflection coating layer comprises a non-conductive material.

* * * * *